United States Patent [19]
Wiesman et al.

[11] Patent Number: 5,892,430
[45] Date of Patent: Apr. 6, 1999

[54] SELF-POWERED POWERLINE SENSOR

[75] Inventors: Richard M. Wiesman, Wayland; Timothy J. Mason, Uxbridge, both of Mass.

[73] Assignee: Foster-Miller, Inc., Waltham, Mass.

[21] Appl. No.: 604,357

[22] Filed: Feb. 21, 1996

Related U.S. Application Data

[63] Continuation of Ser. No. 232,702, Apr. 25, 1994, abandoned.

[51] Int. Cl.$^6$ .................................................. H04M 11/04
[52] U.S. Cl. .............................. 340/310.01; 340/310.07; 324/127; 324/126; 361/93
[58] Field of Search ......................... 340/310.01, 310.07; 324/127, 126, 110, 142; 364/483; 371/14; 361/71, 92, 93

[56] References Cited

U.S. PATENT DOCUMENTS

| | | |
|---|---|---|
| 3,428,896 | 2/1969 | Schweitzer . |
| 3,504,283 | 3/1970 | Meservey . |
| 4,204,194 | 5/1980 | Bogacki . |
| 4,210,901 | 7/1980 | Whyte et al. . |
| 4,268,818 | 5/1981 | Davis et al. . |
| 4,348,638 | 9/1982 | Goldridge ................................ 324/127 |
| 4,384,289 | 5/1983 | Stillwell et al. . |
| 4,420,752 | 12/1983 | Davis et al. . |
| 4,535,447 | 8/1985 | Rosanes et al. . |
| 4,578,639 | 3/1986 | Miller . |
| 4,611,207 | 9/1986 | Anderson et al. . |
| 4,622,535 | 11/1986 | Ise et al. ............................. 340/310 R |
| 4,629,979 | 12/1986 | Missout et al. . |
| 4,668,934 | 5/1987 | Shuey . |
| 4,709,339 | 11/1987 | Fernandes . |
| 4,714,893 | 12/1987 | Smith-Vaniz . |
| 4,724,381 | 2/1988 | Crimmins . |
| 4,758,962 | 7/1988 | Fernandes . |
| 4,777,381 | 10/1988 | Fernandes . |
| 4,786,862 | 11/1988 | Sieron ..................................... 324/126 |
| 4,794,327 | 12/1988 | Fernandes . |
| 4,794,328 | 12/1988 | Fernandes et al. . |
| 4,794,329 | 12/1988 | Schweitzer .............................. 324/127 |
| 4,795,973 | 1/1989 | Smith-Vaniz et al. . |
| 4,799,005 | 1/1989 | Fernandes . |
| 4,801,937 | 1/1989 | Fernandes .......................... 340/870.16 |
| 4,808,916 | 2/1989 | Smith-Vaniz ........................... 324/110 |
| 4,808,917 | 2/1989 | Fernandes et al. . |
| 4,823,022 | 4/1989 | Lindsey . |
| 4,827,272 | 5/1989 | Davis . |
| 4,831,327 | 5/1989 | Chenier et al. ......................... 324/127 |
| 4,847,780 | 7/1989 | Gilker et al. . |
| 4,855,671 | 8/1989 | Fernandes . |
| 4,904,996 | 2/1990 | Fernandes . |
| 4,935,693 | 6/1990 | Falkowski et al. . |
| 4,961,049 | 10/1990 | Ghislanzoni . |
| 4,999,571 | 3/1991 | Ishiko et al. . |
| 5,006,846 | 4/1991 | Granville et al. . |
| 5,015,944 | 5/1991 | Bubash .................................... 324/127 |
| 5,051,733 | 9/1991 | Neuhouser .............................. 340/660 |
| 5,065,142 | 11/1991 | Green ...................................... 340/660 |
| 5,124,642 | 6/1992 | Marx . |
| 5,140,257 | 8/1992 | Davis . |
| 5,210,519 | 5/1993 | Moore .................................. 340/310 R |
| 5,426,360 | 6/1995 | Maraio et al. . |
| 5,473,244 | 12/1995 | Libove et al. . |
| 5,559,377 | 9/1996 | Abraham ................................. 307/104 |
| 5,565,783 | 10/1996 | Lau et al. . |

*Primary Examiner*—Jeffery A. Hofsass
*Assistant Examiner*—Daryl C. Pope
*Attorney, Agent, or Firm*—Iandiorio & Teska

[57] ABSTRACT

A self-powered powerline sensor includes a core layer for wrapping about an a.c. powerline; a winding layer, including of a plurality of windings to be energized by the a.c. powerline, disposed about the core layer; means for sensing a condition in or about the a.c. powerline; and means, powered by the windings, in communication with the means for sensing, for transmitting a signal representative of the sensed condition over the a.c. powerline.

46 Claims, 4 Drawing Sheets

SELF-POWERED POWERLINE SENSOR

This is a continuation of application Ser. No. 08/232,702, filed Apr. 25, 1994 now abandoned.

FIELD OF INVENTION

This invention relates to a self-powered powerline sensor which non-invasively senses conditions in and about an a.c. powerline. The invention further relates to a sensor that derives its power from and is capable of transmitting and receiving signals over the a.c. powerline.

BACKGROUND OF INVENTION

Monitoring a.c. powerlines, in both overhead and underground and primary and secondary applications, is useful to electric utility companies in order to anticipate outages which occur due to faulty equipment and overloads on a.c. powerlines and which result in loss of service for potentially a large number of end customers. The potential for an outage and for the loss of the greatest number of customers is increased during peak periods when power usage is at a maximum and delivery of continuous power is most critical. Outages caused by faulty and overloaded lines are expensive to repair, costly to the electric utility company in terms of dollars lost for lost service and in terms of damage to the utilities reputation and can be dangerous for utility company employees.

The effects of an unexpected outage as a result of a faulty or overloaded powerline are exacerbated if the powerline is underground. Replacing a damaged underground line requires more man hours and increased safety precautions due to the fact that the majority of work required occurs underground in cramped, sometimes wet, and always less than ideal conditions. As a result, repairing such a damaged underground line is even more costly, time consuming and dangerous.

Thus, a.c. powerline sensors which sense electrical conditions, such as power, voltage and current are very useful to electric utility companies in monitoring a.c. powerlines in order to better anticipate the likelihood of an unexpected outage occurring due to faulty and overloaded lines. If the electric utility companies are able to monitor the conditions on the powerlines, they are better able to perform maintenance on and replacement of powerlines which are likely to become deenergized as a result of an overload or fault, thereby lowering the number of unexpected outages. By replacing and maintaining such equipment the utility company can significantly decrease outage time to the end customer. The costs associated with repair or replacement of damaged cables will also be decreased. The cost of replacing or repairing damaged cables may be significantly greater in comparison to normal scheduled maintenance or replacement because of the overtime pay involved.

However, conventional commercial powerline sensors typically require an invasive electrical connection to the power circuit that is being monitored. This type of installation is expensive for the utility company, potentially dangerous for the installer and can cause a service interruption for the end user. Due to these limitations, powerline sensors have not been widely used in the electric utility industry.

SUMMARY OF INVENTION

It is therefore an object of this invention to provide a self-powered powerline sensor that senses conditions in and about an a.c. powerline in a non-invasive manner.

It is a further object of this invention to provide such a self-powered powerline sensor that is powered by low power drawn from the a.c. powerline by non-contacting transformer action.

It is a further object of this invention to provide such a self-powered powerline sensor that is capable of transmitting sensed conditions in and about a.c. powerline over the powerline itself.

It is a further object of this invention to provide such a self-powered powerline sensor that is capable of transmission to and reception of communications from a remote base station over the a.c. powerline by non-contacting transformer action coupling to the a.c. powerline.

It is a further object of this invention to provide such a self-powered powerline sensor that is quickly, easily and safely installed without interrupting or affecting power service to the end customer.

It is a further object of this invention to provide such a self-powered powerline sensor that may be installed on various size powerlines.

It is a further object of this invention to provide such a self-powered powerline sensor that may be installed on closely spaced cables and in restrictive volumes.

It is a further object of this invention to provide such a self-powered powerline sensor that has a low profile, is compact in size and has a low weight.

It is a further object of this invention to provide such a self-powered powerline sensor that is mechanically supported by the a.c. powerline.

It is a further object of this invention to provide such a self-powered powerline sensor that is inexpensive and disposable.

The invention results from the realization that a truly effective self-powered powerline sensor can be achieved by providing a core layer of high permeability ferromagnetic material wrapped about an a.c. powerline, disposing a winding layer, composed of a plurality of windings energized through transformer action by the a.c. powerline, about the core layer, sensing a condition in or about the a.c. powerline and using the power from the windings to transmit a signal over the a.c. powerline representative of the sensed condition.

This invention features a self-powered powerline sensor. There is a core layer for wrapping about an a.c. powerline and a winding layer, including a plurality of windings to be energized by the a.c. powerline, disposed about the core layer. There are means for sensing a condition in or about the a.c. powerline and means, powered by the windings, in communication with the means for sensing, for transmitting a signal representative of the sensed condition over the a.c. powerline.

In a preferred embodiment the windings may be energized by non-contacting transformer action and the means for transmitting may be electrically coupled to the a.c. powerline by non-contacting transformer action. The means for sensing and the means for transmitting may be disposed on the surface of the winding layer. There may further be included a protective covering wrapped about the winding layer covering the means for sensing and the means for transmitting. The protective covering may be an electric insulator and it may be rubber. The protective covering may be secured to the winding layer. There may be further included means for retaining the powerline sensor in a wrapped configuration about the a.c. powerline and the means for retaining may include at least one retaining tie.

The core layer may be wrapped about the a.c. power line in a single wrap configuration or in a spiral wrap configuration. The core layer may be formed of a highly permeable ferromagnetic material which may be steel. The powerline may be a power cable or a wire. The plurality of windings may be formed by wrapping a wire about the core layer and the wire may be electrically conductive. The plurality of windings may be oriented substantially parallel to the a.c. powerline. The means for sensing may be powered by the windings. The windings may be electrically connected to and energize a power supply. The means for sensing may include at least one sensor. The means for sensing may include voltage sensor means which may itself include means in communication with the windings for sensing the voltage induced in the windings by the powerline. The means for sensing may include a current sensor which may be a hall effect sensor. The means for sensing may also include a temperature sensor, a pressure sensor, a gas sensor, a moisture sensor, or a radiation sensor. The means for sensing may include a light sensor which may sense visible or infrared light. The means for transmitting may transmit a signal to a remote base station. There may further be included means for receiving communications from a remote base station. The means for transmitting may include a microcontroller and the microcontroller may receive signals from the means for sensing representative of conditions sensed and it may transmit the signals over the a.c. powerline. The means for transmitting may average the signals received from the means for sensing representative of a condition sensed over a period of time to establish a nominal condition level and detect variances from the nominal level. The variances from the nominal level may be transmitted over the a.c. powerline to a base station. The sensed condition may be voltage.

The system also features a self-powered powerline sensor that includes a core layer for wrapping about an a.c. powerline. There is included a winding layer disposed about the core layer, wherein the winding layer includes a plurality of windings to be energized by the a.c. powerline by non-contacting transformer action. There are means for sensing a condition in or about the a.c. powerline. There are also means electrically coupled to the a.c. powerline by non-contacting transformer action, powered by the windings and in communication with the means for sensing, for transmitting a signal representative of the sensed condition over the a.c. powerline.

The system further features a self-powered powerline sensor that includes a core layer for wrapping about an a.c. powerline. There is also included a winding layer disposed about the core layer that includes a plurality of windings to be energized by the a.c. powerline by non-contacting transformer action. There are means for sensing a condition in or about the a.c. powerline and means, electrically coupled to and powered by the a.c. powerline by non-contacting transformer action through the windings, for transmitting a signal representative of the sensed condition over the a.c. powerline.

The system also features a self-powered powerline sensor that includes a low profile core layer for wrapping about an a.c. powerline. There is included a winding layer, including a plurality of windings to be energized by the a.c. powerline disposed about the core layer. There are means, powered by the winding layer, for sensing a condition in or about the a.c. powerline.

The system further features a self-powered powerline sensor that includes a core layer of high permeability ferromagnetic material for wrapping about an a.c. powerline. There is a winding layer, including a plurality of windings to be energized by the a.c. powerline, disposed about the core layer. The windings are oriented substantially parallel to the direction of the a.c. powerline. There are means for sensing a condition in or about the a.c. powerline. There is a remote base station. There are controller means, powered by the windings, in communication with the means for sensing, for transmitting a signal representative of the sensed condition over the a.c. powerline to the remote base station and for receiving signals transmitted from the remote base station.

The system further features a self-powered powerline sensor that includes means for sensing a condition in or about an a.c. powerline. There are means, in communication with the means for sensing, for receiving signals representative of the sensed condition and averaging the received signals over a period of time to establish a nominal condition level. There are also means for detecting variations of said received signals from said nominal condition level. There are finally means for transmitting the variations on the a.c. powerline.

DISCLOSURE OF PREFERRED EMBODIMENT

Other objects, features and advantages will occur to those skilled in the art from the following description of a preferred embodiment and the accompanying drawings, in which.

Figure 3:
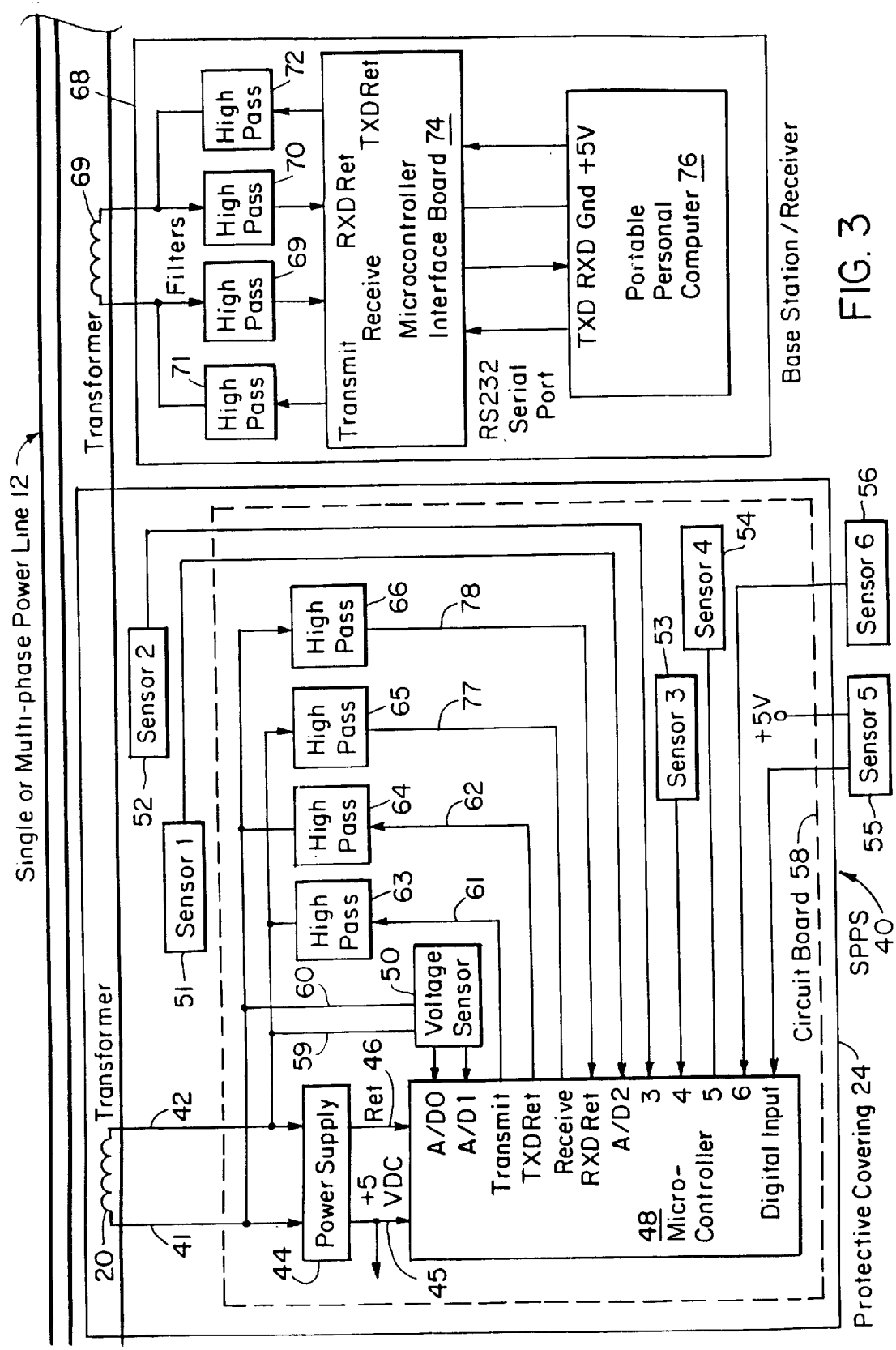
Figure 4:
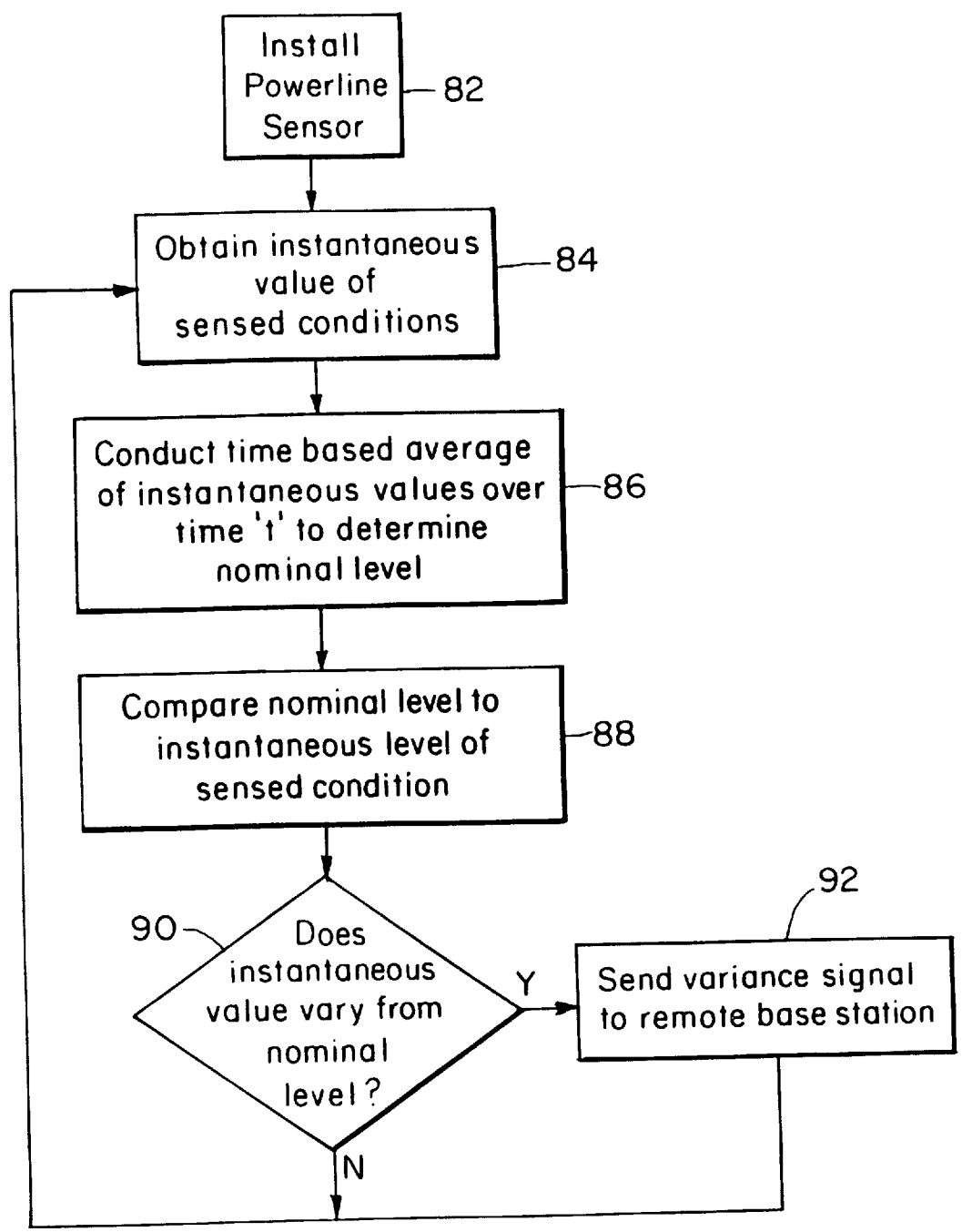

FIG. 3 is a schematic block diagram of the self-powered powerline sensor according to this invention and its electrical connection to an a.c. powerline and a remote base station; and FIG. 4 is a flow chart of the software that may be used by the microcontroller of FIG. 3 in order to construct a time based nominal level for a sensed condition in or about the a.c. powerline to determine variance from the nominal condition in or about the a.c. line.

Figure 1:
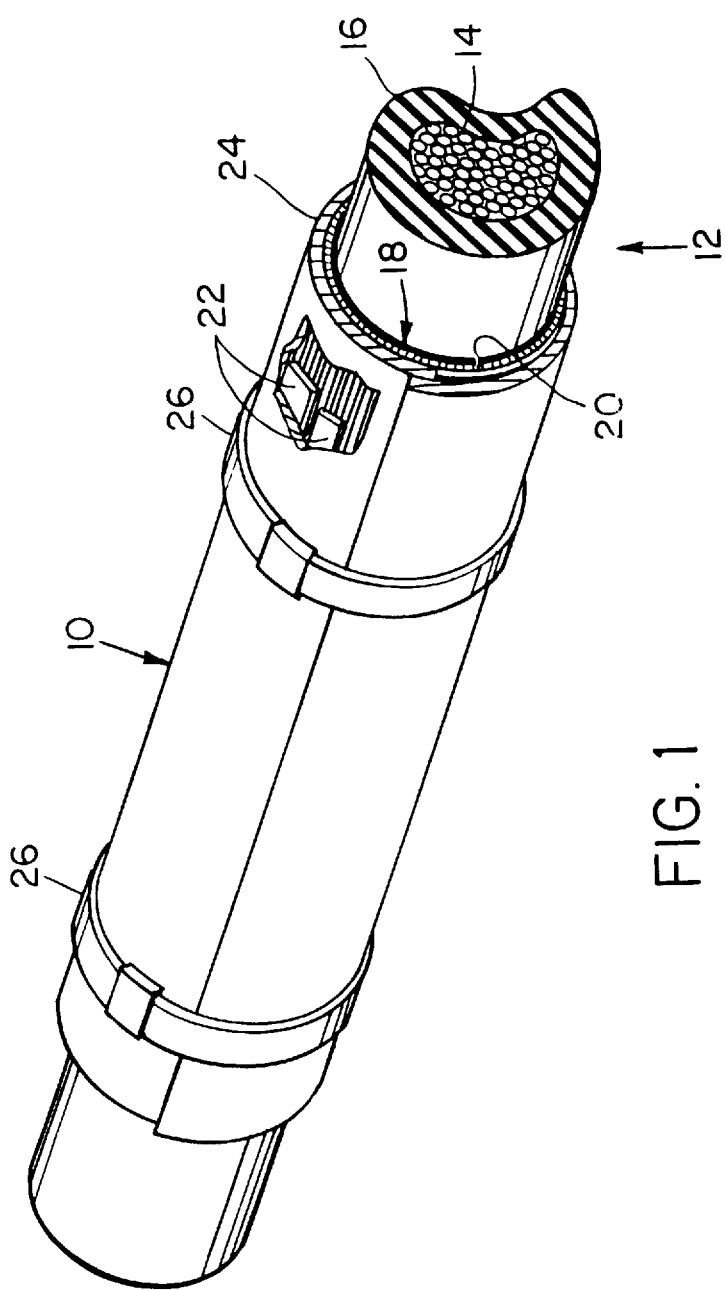
FIG. 1 is a three-dimensional view of a single wrap self-powered powerline sensor according to this invention disposed about an a.c. power cable.

There is shown in FIG. 1 a single wrap self-powered powerline sensor 10 disposed about a.c. power line 12. Power line 12 includes conductive strands (or a single core) 14 and insulating rubber layer 16. The a.c. power line 12 shown is a cable of the type typically used in underground secondary power distribution applications. However, this is not a necessary limitation of this invention, as the powerline sensor of this invention may be utilized in overhead, secondary voltage applications and in overhead and underground primary voltage applications with insulated or uninsulated cable.

Core layer 18 of sensor 10 is a highly permeable ferromagnetic material, or a steel of the type typically used for electric motor laminations or transformer laminations. Core layer 18 is wrapped in a single wrap configuration about the insulating rubber layer 16 of a.c. powerline 12 in a completely non-invasive manner. As the core layer 18 is wrapped about power line 12 it can accommodate various size powerlines. The core layer 18 is typically 6 in. in length, 4 in. in width and 0.025 in. in thickness. However, these dimensions may vary for different size powerlines or for different applications. A plurality of windings 20 are wound about core layer 18 so that they are oriented substantially parallel to the direction of the a.c. powerline 12. The plurality of windings 20 are formed by wrapping a wire, such as 28 gauge magnet wire, about the core layer 18 in a number of turns.

A.C. power in powerline 12 induces a current in windings 20 by non-invasive transformer action. A suitable ratio of windings may be chosen such that a desired current will be induced in the windings 20 when the a.c. powerline is energized. The number of turns in winding 20 will determine the ratio between the current induced in winding 20 and the current in powerline 12 up to the point at which core layer 18 contains an induced flux density which is at or below its level of saturation. The windings 20 are oriented substantially parallel to the direction of the a.c. power line 12 to allow for the most efficient inducement of current in the windings. However, it should be noted that efficiency of the transformer formed by the windings 20 and core layer 18 is not a primary concern and may be sacrificed for lower volume, weight, and cost. The transformer formed by windings 20 and core layer 18 need only be sized to provide sufficient power for the sensors and communication coupling into powerline 12.

Electronic components 22, include the sensors for sensing voltage, current or essentially any physical phenomena, e.g. temperature, pressure, radiation, moisture etc., a power supply powered by the windings energized by non-contacting transformer action with the a.c. power in powerline 12, a microcontroller and various other components which are discussed in more detail below. These electronic components 22 are affixed to a flexible printed circuit board (not shown) which is then placed on the surface of the windings 20 and an electrical connection with the windings 20 is established by discrete wires (not shown) from the windings 20 to the electronic components 22. Certain electronic components 22 such as certain types of sensors, are not affixed to the printed circuit board, but rather they are placed directly on the windings 20 or in other locations most advantageous to sensing the desired phenomena. These electronic components 22 generally shown in FIG. 1 and briefly discussed will be described in more detail below.

Disposed on the windings 20 and covering electronic components 22 is protective covering 24. The protective covering 24 provides electrical insulation, is typically formed of rubber and is affixed to the windings 20 by means of self vulcanizing tape, adhesive, or by some other suitable means. Retaining ties 26 removeably secure the powerline sensor 10 in place about a.c. power line 12. The protective covering effectively sandwiches the electronic components 22 between it and windings 20, as the electronic components on and off the flexible printed circuit board are not secured to the windings 20. However, they may be secured to a suitable flexible substrate for ease of manufacturing and handling.

Powerline sensor 10 is thus easily installed by simply wrapping it about a.c. power line 12 (which may be of varying size) and affixing it thereto by means of retaining ties 26. Moreover, powerline sensor 10 is safe and as installed does not require interruption of power service to the end customer. It operates in a non-invasive manner by non-contacting transformer action and does not require direct electrical connection with the powerline, electrical ground, a neutral line or any other power source.

Figure 2:
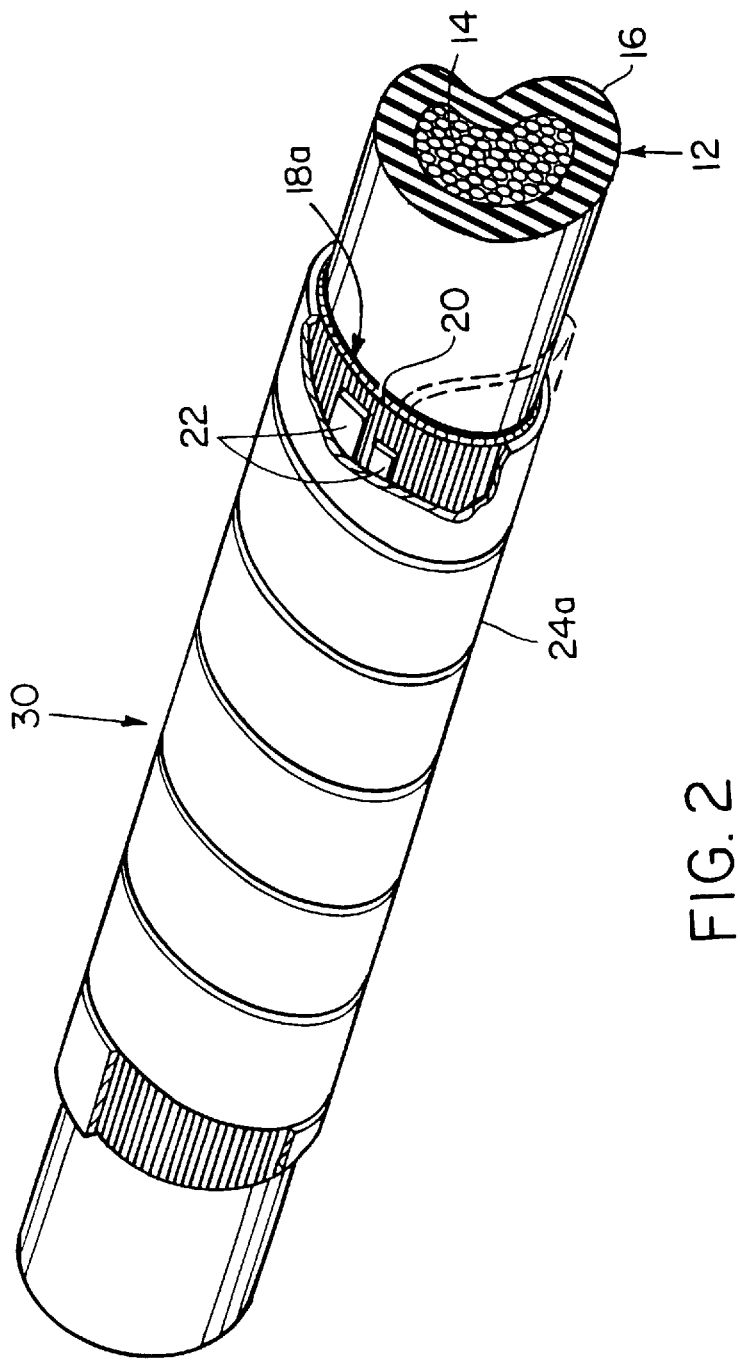
FIG. 2 is a three-dimensional view of an alternative, spiral wrap embodiment of the self-powered powerline sensor according to this invention disposed about an a.c. power cable.

Spirally wrapped, self-powered powerline sensor 30, FIG. 2, is an alternative embodiment of the self-powered powerline sensor of FIG. 1. In this embodiment the core layer 18a is shown spirally wrapped about insulating rubber layer 16 of a.c. powerline 12. Core layer 18a is typically the same thickness as core layer 18 (0.025 in.), FIG. 1, however its length is approximately 40 in. and its width is approximately 0.5 in. These dimensions may vary to accommodate different size powerlines and different applications. The core layer 18a is spirally wrapped about the a.c. power line 12 a number of times.

A plurality of windings 20 are disposed about the core layer 18a to form a winding layer which windings are energized by the a.c. power line 12 by non-contacting transformer action. Electronics components 22 are similarly placed on windings 20 (flexible printed circuit board not shown) and protective covering 24a, covering electronic components 22, is disposed on windings 20 by means of self vulcanizing tape, adhesives, or other suitable means.

Self-powered powerline sensor 40, FIG. 3, is electrically connected to a.c. power line 12, which may be a single or multi-phase power line, by means of transformer windings 20 by non-contacting transformer action. The transformer windings 20 are connected to power supply 44 by means of lines 41 and 42. Power supply 44, which may be an a.c. to d.c. regulator integrated circuit, provides 5V d.c. to microcontroller 48 over lines 45 and 46. Microcontroller 48 may be an 8-bit embedded-controller with analog to digital converter. Any one of the Sensors 50–56 connected to microcontroller 48 may be powered by power supply 44 if necessary. However, sensor 55 is the only sensor shown in FIG. 3 powered by power supply 44. The sensors provide an analog or digital signal to microcontroller 48 representative of the particular condition sensed in or about a.c. powerline 12.

Voltage sensor 50 includes leads 59 and 60 connected to lines 41 and 42 from transformer windings 20 which directly input signals representative of a.c. powerline voltage into microcontroller 48. This sensor 50 does not provide an absolute voltage reading since there is no reference voltage, it does however, provide the microcontroller with a signal indicative of an instantaneous non-referenced voltage level. A nominal voltage level can be determined by monitoring the instantaneous voltage levels supplied by voltage sensor 50 over a period of time and a variation from the nominal voltage level can be resolved from the instantaneous input from the voltage sensor 50 after the nominal level is established. This procedure will be described in more detail with regard to FIG. 4.

Sensors 51 and 52 are located outside of the circuit board area 58, but within the protective covering 24. Thus, these sensors are physically located on top of the transformer windings 20. Sensors 53 and 54 are located on circuit board 58 and sensors 55 and 56 are located outside of protective covering 24 and are actually physically located on top of or remote from the protective covering 24. These sensors can sense, for example, current, temperature, pressure, gas, moisture, radiation or light (visible or infrared). In fact, a sensor for sensing virtually any physical phenomena could be utilized. Certain sensors, such as a temperature sensor or a radiation sensor may be installed directly on circuit board 58, as sensors 53 and 54 are shown to be installed. Other sensors, like sensors 51 and 52, operate more effectively away from the printed circuit board, such as a hall effect current sensor. Gas and light sensors, for example, would operate only if outside of the protective covering 24, as depicted by sensors 55 and 56.

Sensors 50–56 continuously sense various conditions in and about a.c. powerline 12 and provide microcontroller 48 with analog or digital signals representative of these sensed conditions. The signals provided by the sensors are converted to digital signals, if necessary, by microcontroller 48 which then generates a communications code that is sent to lines 41 and 42 connected to transformer windings 20 over lines 61 and 62 through high pass filters 63 and 64. High pass filters 63 and 64 allow the high frequency communications code which provides information representative of the sensed conditions to pass to transformer windings 20 which are then coupled by non-contacting transformer action to a.c. power line 12 and transmitted thereon.

The data transmitted from microcontroller 48 contains an identification code which identifies that particular self-powered powerline sensor 40 and an identification code for each particular sensor 50–56, carried by powerline sensor 40, indicating the type of data that is being transmitted. That is, the transmission includes information about where the transmission is originating from (many self-powered powerline sensors according to this invention can be utilized in many various locations throughout an electric utility company's distribution system) and information about the type of data being transmitted; i.e. whether it be data regarding voltage, current, temperature, radiation, etc. The transmission of an identification code and the data of interest can occur on a regular basis, on a time basis, when particular threshold values are sensed, or according to any desired special algorithm.

The communications code may follow a selected formal communication system specification or protocol. The protocols may be based on the OSI (Open Systems Interconnect) reference model for communications developed by the ISO (International Organization for Standardization), Geneva, Switzerland. Any other communications code that would be suitable for powerline communications could also be utilized.

The data transmitted from self-powered powerline sensor 40 is received by remote base station 68. Base station 68 includes transformer windings 69 which couple, by non-contacting transformer action, the transmitted data to high-pass filters 69 and 70 that allow the high frequency data transmitted to be communicated to microcontroller interface 74. The transmitted information received at base station 68 need not be coupled by non-contacting transformer action. Any other suitable means of coupling could be utilized. The transmitted data is then forwarded to computer 76 where the sensor information may be evaluated.

Base station 68 is also capable of transmitting data to self-powered powerline sensor 40 which is capable of receiving such data. Then, for example, the base station 68 could poll self-powered powerline sensor 40 and any other powerline sensors on the system for sensor information on demand instead of passively awaiting transmissions from the powerline sensors. Moreover, the powerline sensors could be reprogrammed from base station 68.

Base station 68 includes high pass filters 71 and 72 which couple transmission signals from base station 68 by non-contacting transformer action through windings 69 to a.c. powerline 12. These transmission signals are then coupled from a.c. powerline 12 to powerline sensor 40 by non-contacting transformer action through windings 20. Leads 41 and 42 from windings 20 are connected to high pass filters 65 and 66 which allow the transmitted signals to pass over lines 77 and 78 to microcontroller 48.

Microcontroller 48 performs the analog-to-digital conversion of the sensed conditions from sensors 50–56, manipulates and updates the memory locations which store previous sensed conditions, performs numerical operations such as determining a moving time average, etc., keeps track of the time for synchronization purposes, and controls the communications between self-powered powerline sensor 40 and base station 66.

Microcontroller 48 can provide base station 68 with actual instantaneous values of the particular sensed conditions, i.e. an actual temperature or radiation reading. However, it can also provide base station 68 with an indication that a particular condition being sensed has varied from a nominal level and the amount of such variance. As discussed briefly above, this type of data transmission with regard to voltage sensing in the a.c. powerline is required because there is no reference level that the sensed voltage can be compared with in order to determine an actual voltage value. Thus, the voltage sensed must be compared with a nominal level and the variance of the sensed voltage from the nominal level can be determined and transmitted to base station 68. Although this process is not required to be performed with all types of sensors (since many sensors provide an absolute value of the conditions sensed as an output) it may be more useful to provide the variance from the nominal level of the conditions sensed rather than providing an actual sensed value. This is so because in many instances the conditions that are being monitored are not being monitored for their actual value, but rather for a variance from some nominal value.

The microcontroller 48 of FIG. 3 may operate according to flow chart 80, FIG. 4, in order to detect and transmit variances from a nominal level of a sensed condition. At step 82 the self-powered powerline sensor is installed and a condition or conditions (e.g. voltage, current, temperature, radiation, etc.) are continuously, instantaneously obtained at step 84. At step 86 a time based average of the instantaneous values of the sensed condition over time t is conducted to determine a nominal level for that condition on the a.c. power line that the self-powered powerline sensor is monitoring. At this point the initial calibration is complete, in that the nominal level has been determined. The calibration process can take anywhere from several seconds, to weeks or even up to a month to obtain an accurate nominal level reading. After the initial calibration process is complete, at step 88 the instantaneous value obtained at step 84 is compared to the nominal level. After the initial time based average is determined at step 86 the time based average is continually recalculated from new instantaneous sensor data. At step 90 it is determined if the instantaneous value varies from the nominal level, and if it does a signal indicating that there is a variance and the extent of the variance is transmitted to the remote base station at step 92. Whether or not a variance was detected the system then returns to step 84 where another instantaneous value is obtained and the process continuous until the self-powered powerline sensor is removed from the a.c. power line or a determination of the variance in the particular condition being sensed is no longer required.

Although specific features of the invention are shown in some drawings and not others, this is for convenience only as each feature may be combined with any or all of the other features in accordance with the invention.

Other embodiments will occur to those skilled in the art and are within the following claims:

What is claimed is:

1. A self-powered powerline sensor, comprising:
   a core layer for wrapping about an a.c. powerline;
   a winding layer, including a plurality of windings to be energized by the a.c. powerline, disposed about said core layer;

means for sensing a condition in or about the a.c. powerline, said means for sensing located proximate said a.c. powerline; and means, powered by said windings, in communication with said means for sensing, for transmitting a signal representative of the sensed condition over the a.c. powerline; said signal being coupled to the a.c. powerline by non-contacting transformer action.

2. The self-powered powerline sensor of claim 1 in which said plurality of windings are energized by non-contacting transformer action.

3. The self-powered powerline sensor of claim 1 in which said means for sensing and said means for transmitting are disposed on the surface of said winding layer.

4. The self-powered powerline sensor of claim 3 further including a protective covering wrapped about said winding layer covering said means for sensing and said means for transmitting.

5. The self-powered powerline sensor of claim 4 in which said protective covering is an electrical insulator.

6. The self-powered powerline sensor of claim 4 in which said protective covering is rubber.

7. The self-powered powerline sensor of claim 4 in which said protective covering is secured to said winding layer.

8. The self-powered powerline sensor of claim 1 further including means for retaining the powerline sensor in a wrapped configuration about said a.c. powerline.

9. The self-powered powerline sensor of claim 8 in which said means for retaining includes at least one retaining tie.

10. The self-powered powerline sensor of claim 1 in which said core layer is wrapped about said a.c. powerline in a single wrap configuration.

11. The self-powered powerline sensor of claim 1 in which core layer is wrapped about said a.c. powerline in a spiral wrap configuration.

12. The self-powered powerline sensor of claim 1 in which said core layer is formed of a highly permeable ferromagnetic material.

13. The self-powered powerline sensor of claim 1 in which said core layer is steel.

14. The self-powered powerline sensor of claim 1 in which said powerline is a power cable.

15. The self-powered powerline sensor of claim 1 in which said powerline is a wire.

16. The self-powered powerline sensor of claim 1 in which said plurality of windings are formed by wrapping a wire about said core layer.

17. The self-powered powerline sensor of claim 16 in which said wire is electrically conductive.

18. The self-powered powerline sensor of claim 1 in which said plurality of windings are oriented parallel to said a.c. powerline.

19. The self-powered powerline sensor of claim 1 in which said means for sensing is powered by said plurality of windings.

20. The self-powered powerline sensor of claim 1 in which said plurality of windings are electrically connected to and energize a power supply.

21. The self-powered powerline sensor of claim 1 in which said means for sensing includes at least one sensor.

22. The self-powered powerline sensor of claim 1 in which said means for sensing includes voltage sensor means.

23. The self-powered powerline sensor of claim 22 in which said voltage sensor means includes means in communication with said windings for sensing the voltage induced in said windings by the powerline.

24. The self-powered powerline sensor of claim 1 in which said means for sensing includes a current sensor.

25. The self-powered powerline sensor of claim 24 in which said current sensor is a hall effect sensor.

26. The self-powered powerline sensor of claim 1 in which said means for sensing includes a temperature sensor.

27. The self-powered powerline sensor of claim 1 in which said means for sensing includes a pressure sensor.

28. The self-powered powerline sensor of claim 1 in which said means for sensing includes a gas sensor.

29. The self-powered powerline sensor of claim 1 in which said means for sensing includes a moisture sensor.

30. The self-powered powerline sensor of claim 1 in which said means for sensing includes a radiation sensor.

31. The self-powered powerline sensor of claim 1 in which said means for sensing includes a light sensor.

32. The self-powered powerline sensor of claim 31 in which said light sensor senses visible light.

33. The self-powered powerline sensor of claim 31 in which said light sensor senses infrared light.

34. The self-powered powerline sensor of claim 1 in which said means for transmitting transmits said signal to a remote base station.

35. The self-powered powerline sensor of claim 1 further including means, in communication with said winding layer, for receiving communications from a remote base station.

36. The self-powered powerline sensor of claim 1 in which said means for transmitting includes a microcontroller.

37. The self-powered powerline sensor of claim 36 in which said microcontroller receives signals from said means for sensing representative of conditions sensed and transmits said signals over the a.c. powerline.

38. The self-powered powerline sensor of claim 1 in which said means for transmitting averages said signals received from said means for sensing representative of said condition sensed over a period of time to establish a nominal condition level and detects variances from said nominal level.

39. The self-powered powerline sensor of claim 38 in which said variances from said nominal level are transmitted over said a.c. powerline.

40. The self-powered powerline sensor of claim 39 in which said transmitted variances are transmitted to a base station.

41. The self-powered powerline sensor of claim 38 in which said sensed condition is voltage.

42. A self-powered powerline sensor, comprising:

a core layer for wrapping about an a.c. powerline;

a winding layer disposed about said core layer;

said winding layer including a plurality of windings to be energized by the a.c. powerline by non-contacting transformer action;

means for sensing a condition in or about the a.c. powerline, said means for sensing located proximate said a.c. powerline; and means, powered by said windings and in communication with said means for sensing, for transmitting a signal representative of the sensed condition over the a.c. powerline; said signal being coupled to the a.c. powerline by non-contacting transformer action.

43. A self-powered powerline sensor, comprising:

a core layer of high permeability ferromagnetic material for wrapping about an a.c. powerline;

a winding layer, including a plurality of windings to be energized by said a.c. powerline, disposed about said core layer; said windings oriented parallel to said a.c. powerline;

means for sensing a condition in or about said a.c. powerline, said means for sensing located proximate said a.c. powerline;

a remote base station; and controller means, powered by said windings, in communication with said means for sensing, for transmitting a signal representative of said sensed condition over said a.c. powerline to said remote base station and for receiving signals transmitted from said remote base station.

44. A self-powered powerline sensor, comprising:

means for sensing a condition in or about an a.c. powerline;

means, in communication with the means for sensing, for receiving signals representative of the sensed condition and averaging the received signals over a period of time to establish a nominal condition level;

means, responsive to said means for receiving, for detecting variations of said received signals from said nominal condition level; and means, responsive to said means for detecting, for transmitting said variations on the a.c. powerline.

45. A self-powered powerline sensor, comprising:

a core layer for wrapping about an a.c. powerline;

a winding layer, including a plurality of windings to be energized by the a.c. powerline, disposed about said core layer;

means for sensing a condition in or about said a.c. powerline, said means for sensing located proximate said a.c. powerline;

a remote base station; and controller means, powered by said windings, in communication with said means for sensing, for transmitting a signal representative of said sensed condition over said a.c. powerline to said remote base station and for receiving signals transmitted from said remote base station.

46. A self-powered powerline sensor, comprising:

means for sensing a condition in or about an a.c. powerline;

means, in communication with said means for sensing, for receiving signals representative of the sensed condition and averaging the received signals over a period of time to establish a nominal condition level; and means, responsive to said means for receiving, for detecting variations of said received signals from said nominal condition level.

* * * * *